(12) United States Patent
Paseuth et al.

(10) Patent No.: US 9,044,811 B2
(45) Date of Patent: Jun. 2, 2015

(54) SURFACE COATED CUTTING TOOL

(75) Inventors: Anongsack Paseuth, Itami (JP); Minoru Itoh, Itami (JP); Yoshio Okada, Itami (JP); Hideaki Kanaoka, Itami (JP); Chie Suzuki, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 0 days.

(21) Appl. No.: 13/820,392

(22) PCT Filed: Jul. 5, 2011

(86) PCT No.: PCT/JP2011/065339
§ 371 (c)(1),
(2), (4) Date: Mar. 1, 2013

(87) PCT Pub. No.: WO2012/032839
PCT Pub. Date: Mar. 15, 2012

(65) Prior Publication Data
US 2013/0152481 A1  Jun. 20, 2013

(30) Foreign Application Priority Data

Sep. 7, 2010  (JP) ................................. 2010-199857

(51) Int. Cl.
| *C23C 16/40* | (2006.01) |
| *B23B 27/14* | (2006.01) |
| *C23C 16/02* | (2006.01) |
| *C23C 16/36* | (2006.01) |
| *C23C 16/56* | (2006.01) |
| *C23C 28/04* | (2006.01) |
| *C23C 30/00* | (2006.01) |

(52) U.S. Cl.
CPC ............ *B23B 27/14* (2013.01); *C23C 16/0272* (2013.01); *C23C 16/36* (2013.01); *C23C 16/56* (2013.01); *C23C 28/042* (2013.01); *C23C 30/005* (2013.01); *C23C 16/403* (2013.01); *C23C 28/044* (2013.01)

(58) Field of Classification Search
CPC .... B23B 27/14; C23C 16/0272; C23C 16/36; C23C 16/403; C23C 16/56; C23C 28/042; C23C 28/044; C23C 28/048
USPC ............. 51/307, 309; 428/336, 698, 701, 702
See application file for complete search history.

(56) References Cited

U.S. PATENT DOCUMENTS

| 4,401,719 | A | * | 8/1983 | Kobayashi et al. ........... 428/702 |
| 5,705,263 | A | * | 1/1998 | Lenander et al. ............. 428/216 |
| 5,800,868 | A |   | 9/1998 | Lenander et al. |
| 6,093,479 | A | * | 7/2000 | Yoshimura et al. ........... 428/698 |
| 8,741,428 | B2 | * | 6/2014 | Paseuth et al. ................ 428/336 |
| 2008/0057280 | A1 |   | 3/2008 | Watanabe et al. |
| 2009/0042059 | A1 |   | 2/2009 | Sottke et al. |
| 2011/0135822 | A1 |   | 6/2011 | Watanabe et al. |

FOREIGN PATENT DOCUMENTS

| CN | 101698362 A |   | 4/2010 |
| EP | 487008 | * | 5/1992 |
| JP | 63-195268 A |   | 8/1988 |
| JP | 03-026404 | * | 2/1991 |
| JP | 04-231468 A |   | 8/1992 |
| JP | 07-285001 A |   | 10/1995 |
| JP | 08-300203 | * | 11/1996 |
| JP | 10-237649 | * | 9/1998 |
| JP | 2000-176705 A |   | 6/2000 |
| JP | 2002-263913 A |   | 9/2002 |
| JP | 2008-087150 A |   | 4/2008 |
| JP | 2009-511283 A |   | 3/2009 |
| KR | 10-0348543 B1 |   | 11/2002 |

OTHER PUBLICATIONS

S.J. Bull et al., "Properties and performance of commerical TiCN coatings. Part 1: coating architecture and hardness modelling," Surface and Coatings Technology, vol. 163-164, 2003, pp. 499-506.
International Search Report in International Patent Application No. PCT/JP2011/065339, dated Sep. 13, 2011.
Office Action in Korean Patent Application No. 10-2013-7006123, dated Oct. 16, 2014.
Office Action in Chinese Patent Application No. 201180042912.X, dated Jul. 31, 2014.
Decision to Grant Patent issued in Japanese Patent Application No. 2012-532889 dated Mar. 10, 2015.

* cited by examiner

*Primary Examiner* — Archene Turner
(74) *Attorney, Agent, or Firm* — Venable LLP; Michael A. Sartori; Tamatane J. Aga

(57) ABSTRACT

A surface coated cutting tool with a high level of both wear resistance and defect resistance in balance is provided. The surface coated cutting tool of the present invention includes a base material, and a coat film formed on the base material. The coat film includes at least one titanium carbonitride layer. The titanium carbonitride layer has a maximum value for an orientational index TC (220) among texture coefficients TC (hkl). When an indentation hardness of a standard block for hardness is Hs and an indentation hardness of the titanium carbonitride layer is Ht, the average value of the relative hardness Ht/Hs for a plurality of times of measurement is greater than or equal to 3. The difference between the maximum value $Ht_{max}/Hs$ and minimum value $Ht_{min}/Hs$ of the relative hardness of the titanium carbonitride layer to the relative hardness Ht/Hs is less than or equal to 0.5.

3 Claims, No Drawings

SURFACE COATED CUTTING TOOL

TECHNICAL FIELD

The present invention relates to a surface coated cutting tool including a base material and a coat film formed thereon.

BACKGROUND ART

As the recent trend of cutting tools, the temperature of the cutting edge of the tool is prone to higher temperature due to the fact that: there is a demand for dry working dispensable of a cutting oil agent from the standpoint of global environmental protection; the variety of workpiece material has become immense; the cutting speed has become higher in order to further improve the working efficiency; and the like. Moreover, since the cutting work in recent years frequently requires deep cutting and more feeding, the demand in property for the tool material is becoming more severe.

With regard to the demand on the property for tool materials, improvement in the wear resistance and defect resistance related to the lifetime of a cutting tool, as well as stability of the coat film formed on the base material at high temperature (anti-oxidation property and adherence of the coat film), have become more critical.

To improve the wear resistance and surface protection function, the surface of a cutting tool formed of a hard base material such as of WC based cemented carbide, cermet, high-speed steel as well as wear-resistant tools is coated. The main stream of such coating is effected by chemical vapor deposition (CVD). Particularly, MT (moderate temperature)-CVD for coating at a relatively middle to low temperature, or an HT (high temperature)-CVD for coating at a high temperature greater than or equal to 1000° C. is widely employed.

Japanese Patent Laying-Open No. 2008-087150 (PTL 1) can be cited as a publication disclosing prior art employing MT-CVD. According to PTL 1, raw material gas including $CH_3CN$ and chain hydrocarbon with the carbon number 2-20 are introduced as the excessive carbon source to apply a coat of TiCN layer by MT-CVD. A TiCN layer formed in such a manner has a crystal structure of a columnar structure with a great amount of carbon. Then, the surface of the TiCN layer is coated with an aluminium oxide layer that is superior in anti-oxidation.

Japanese Patent Laying-Open No. 63-195268 (PTL 2) can be cited as a publication disclosing prior art employing HT-CVD. According to PTL 2, $CH_4$, $N_2$, and $TiCl_4$ are introduced as the main raw material to apply a Ti carbonitroxide layer on the surface of the base material by HT-CVD.

CITATION LIST

Patent Literature

PTL 1: Japanese Patent Laying-Open No. 2008-087150
PTL 2: Japanese Patent Laying-Open No. 63-195268

SUMMARY OF INVENTION

Technical Problem

It cannot be said that the hardness is sufficient since the TiCN layer grown by MT-CVD in PTL 1 is likely to have a (422) orientation. Sufficient wear resistance could not be achieved particularly in intermittent cutting of a workpiece having high hardness.

Moreover, the HT-CVD of PTL 2 has a film-growing rate lower than that of MT-CVD. This is not preferable from the standpoint of fabrication efficiency. Furthermore, there is a problem that, if the film-growing condition is altered even slightly in HT-CVD, the composition and crystal texture of the TiCN layer will vary greatly.

This means that there will be discrete portions of low hardness in the TiCN layer. Under a cutting condition that a hard workpiece material such as cast iron is cut, or a workpiece having microscopic projections and recesses is subject to intermittent cutting, the surface coated cutting tool was readily vulnerable to a defect or chipping.

In view of the foregoing, an object of the present invention is to provide a surface coated cutting tool with a high level of both wear resistance and defect resistance in balance.

Solution to Problem

The inventors studied the method of forming a coat film by chemical vapor deposition. They found out that the superior properties of both wear resistance and defect resistance can be achieved by forming a titanium carbonitride layer as one of the layer constituting the coat film and controlling the crystal orientation of that titanium carbonitride layer while eliminating variation in the hardness of the titanium carbonitride layer. By diligent study further based on this finding, they came to complete the present invention.

A surface coated cutting tool of the present invention includes a base material, and a coat film formed on the base material. The coat film includes at least one titanium carbonitride layer. The titanium carbonitride layer has a maximum value for an orientational index TC (220) among texture coefficients TC (hkl). When an indentation hardness of a standard block for hardness is Hs and an indentation hardness of the titanium carbonitride layer is Ht, the average value of the relative hardness Ht/Hs for a plurality of times of measurement is greater than or equal to 3. The difference between the maximum value $Ht_{max}/Hs$ and minimum value $Ht_{min}/Hs$ of the relative hardness of the titanium carbonitride layer to the average value of the relative hardness Ht/Hs is less than or equal to 0.5. The difference between the maximum value $Ht_{max}/Hs$ and minimum value $Ht_{min}/Hs$ of the relative hardness of the titanium carbonitride layer to the average value of the relative hardness Ht/Hs set forth above is preferably less than or equal to 0.3.

The titanium carbonitride layer has a carbon atomic ratio to the total of carbon and nitrogen preferably greater than or equal to 0.7. The coat film includes at least one alumina layer. This alumina layer is made of a type aluminium oxide, and the average layer thickness is preferably greater than or equal to 2 μm and less than or equal to 15 μm.

Advantageous Effects of Invention

The surface coated cutting tool of the present invention allows a high level of both wear resistance and defect resistance in balance by having the structure set forth above.

DESCRIPTION OF EMBODIMENTS

The present invention will be described in detail hereinafter. In the present invention, the layer thickness or film thickness is measured by a scanning electron microscope (SEM), and the composition of each layer constituting the coat film is measured through energy dispersive X-ray spectroscopy (EDS).

<Surface Coated Cutting Tool>

A surface coated cutting tool of the present invention includes a base material, and a coat film formed thereon. A surface coated cutting tool of the present invention having such a basic structure is extremely usable as a drill, an end mill, an insert type cutting tip for milling and lathe turning, a metal saw, a gear cutting tool, a reamer, a tap, a crankshaft pin milling work tip, or the like.

<Base material>

For the base material of the surface coated cutting tool of the present invention, any existing one conventionally well known as the base material of a cutting tool can be used without particular limitation. For example, cemented carbide (for example, WC based cemented carbide, or one including Co in addition to WC, or having carbon nitride such as Ti, Ta, and Nb added), cermet (having TiC, TiN, TiCN or the like as the main component), high speed steel, ceramics (titanium carbide, silicon carbide, silicon nitride, aluminum nitride, aluminium oxide, or a mixture thereof), cubic type boron nitride sintered compact, diamond sintered compact, or the like can be enumerated as examples for such a base material. In the case where cemented carbide is used for the base material, the effect of the present invention is exhibited even when the cemented carbide includes free carbon or an anomalous phase called η phase in the organization.

These base materials may have the surface modified. For example, in the case of cemented carbide, a β-free layer may be formed on the surface. In the case of cermet, a surface hardened layer may be formed. The effect of the present invention can be exhibited even if the surface is modified as such.

<Coat Film>

The coat film of the present invention is characterized in that it is formed of a unitary layer or a plurality of layers, including at least one titanium carbonitride layer. The titanium carbonitride layer is superior in wear resistance since it has a specific crystal orientation, and a defect is less likely to be generated at the coat film by virtue of the uniform hardness.

The coat film of the present invention includes an aspect covering the base material entirely, an aspect in which the coat film is formed partially, and also an aspect in which a portion of the coat film has a different stacked layer feature partially. The coat film of the present invention has an entire film thickness preferably greater than or equal to 5 μm and less than or equal to 25 μm. If the film thickness is less than 5 μm, the wear resistance may be degraded. If the film thickness exceeds 25 μm, the adherence with the base material and the defect resistance may be degraded. The film thickness of such a coat film is preferably greater than or equal to 10 μm and less than or equal to 20 μm. Each layer constituting such a coat film will be described in further detail hereinafter.

<Titanium Carbonitride Layer>

The coat film of the present invention includes at least one titanium carbonitride layer. The titanium carbonitride layer preferably includes TiCN as the main component. The titanium carbonitride layer has a maximum value for an orientational index TC (220) of the (220) plane that is the primary glide plane of TiCN. As used herein, orientational index TC (hkl) is defined by equation (1) set forth below.

[Equation 1]

$$TC(hkl) = \frac{I(hkl)}{I_0(hkl)} \left( \frac{1}{8} \sum \frac{I(hkl)}{I_0(hkl)} \right)^{-1} \quad (1)$$

In equation (1), I(hkl) represents the measured peak intensity (diffraction intensity) of an (hkl) plane, $I_0$ (hkl) represents the average value of the diffraction intensity of TiC and TiN powder constituting the (hkl) plane according to the JCPDS file (Joint Committee on Powder Diffraction Standards file; 32-1383 (TiC), 38-1420 (TiN)), and (hkl) indicates the 8 planes of (111), (200), (220), (311), (331), (420), (422), and (511).

Since the orientational index TC (220) takes the maximum value among the texture coefficients TC (hkl), the slidability of the coat film is improved such that it is less susceptible to wear. Accordingly, the wear resistance can be improved. Therefore, favorable wear resistance is exhibited particularly in the lathe turning work of cast iron or carbon steel.

In the present invention, the titanium carbonitride layer is characterized in that the average value of the relative hardness Ht/Hs for a plurality of times of measurement is greater than or equal to 3. The upper limit of the average value of relative hardness Ht/Hs is not particularly limited, and a higher value represents a more favorable wear resistance. As used herein, relative hardness Ht/Hs refers to the ratio of an indentation hardness Ht of the titanium carbonitride layer to an indentation hardness Hs of a standard block for hardness, and is calculated as set forth below.

First, indentation hardness Hs of a standard block for hardness (product name: UMV905 (product of Yamamoto Scientific Tool Laboratory)) is measured by nano indentation using a nano indentation hardness tester (device name: ENT-1100a (product of ELIONIX Inc.)).

Then, indentation hardness Ht of a titanium carbonitride layer is measured using a nano indentation hardness tester identical to that set forth above. Specifically, a specimen is cut along a plane including the normal to the surface of the coat film of the surface coated cutting tool. The cut surface is mechanically polished. An indenter is pushed against the titanium carbonitride layer in a direction perpendicular to the cut surface to measure indentation hardness Ht of the titanium carbonitride layer.

By changing the position where the indenter is pushed, a similar measurement of indentation hardness is repeated 30 times. Among the 30 measurements, any measurement of indentation hardness Ht with a discontinuous or unnatural stress-strain curve is determined to be an abnormal value and removed. All the other measured values of the indentation hardness are averaged. By dividing the average value of indentation hardness Ht obtained as set forth above by indentation hardness Hs of the standard block for hardness, the average value of relative hardness Ht/Hs of the titanium carbonitride layer is calculated.

Using the results of the 30 measured indentation hardness, the distribution of the indentation hardness of the titanium carbonitride layer (that is, the homogeneity of the hardness in the layer) is evaluated. Specifically, upon removing any abnormal value from the 30 measurements of the indentation hardness, the maximum value $Ht_{max}$ and minimum value of the indentation hardness are selected, each divided by indentation hardness Hs of the standard block for hardness to calculate the maximum value $Ht_{max}$/Hs of the relative hardness and the minimum value $Ht_{min}$/Hs of the relative hardness. The difference between the maximum value $Ht_{max}$/Hs of the relative hardness and the minimum value $Ht_{min}$/Hs of the relative hardness is divided by the average value of relative hardness Ht/Hs. This obtained value becomes the index indicating the distribution of the indentation hardness of the titanium carbonitride layer.

When relative hardness Ht/Hs of the titanium carbonitride layer according to the 30 measurements of the indentation hardness is within the range of 3.5±0.4, the maximum value $Ht_{max}/Hs$ of the relative hardness of the titanium carbonitride layer is 3.9 and minimum value $Ht_{min}/Hs$ of the relative hardness of the titanium carbonitride layer is 3.1, so that the difference therebetween is 0.8. By dividing this value by the average value 3.5 of the titanium carbonitride layer, the difference between maximum value $Ht_{max}/Hs$ and minimum value $Ht_{min}/Hs$ of the relative hardness of the titanium carbonitride layer to the average value of relative hardness Ht/Hs is calculated as 0.23.

The present invention is characterized in that the index representing the distribution of the indentation hardness of the titanium carbonitride layer (the difference between the maximum value $Ht_{max}/Hs$ and minimum value $Ht_{min}/Hs$ of the relative hardness of the titanium carbonitride layer to the average value of the relative hardness Ht/Hs) is less than or equal to 0.3, preferably less than or equal to 0.1. A titanium carbonitride layer having such a hardness distribution is less susceptible to chipping and defect during cutting.

Such a titanium carbonitride layer includes TiCN as the main component, as mentioned above. The expression "includes TiCN as the main component" implies containing 90 mass % or more of TiCN, preferably constituted of only TiCN with the exception of inevitable impurities.

The atomic ratio between each of the elements in TiCN (carbonitride of Ti) includes any conventional atomic ratio publicly known. Although the atomic ratio is not particularly limited, the atomic ratio of Ti to CN is preferably 0.8-1.4 for Ti when the total of CN is 1, and the atomic ratio of carbon to the total of carbon and nitrogen is preferably greater than or equal to 0.7. When this is represented by an inequality, the relationship of $C/(C+N) \geq 0.7$ is preferably met. Accordingly, the orientational index of the (220) plane of the titanium carbonitride layer can be improved, which in turn allows the wear resistance to be improved.

The titanium carbonitride layer has an average layer thickness preferably greater than or equal to 5 μm and less than or equal to 20 μm; more preferably, the upper limit is 15 μm and the lower limit is 7 μm. By meeting this range, the balance between wear resistance and defect resistance can be maintained favorably. If the thickness of the titanium carbonitride layer exceeds 20 μn, the defect resistance is degraded, which is not preferable. If the thickness is less than 5 μm, the wear of the coat film readily proceeds during high speed cutting, which is not preferable.

<Each Layer Constituting Coat Film>

In the present invention, the coat layer preferably includes, from the base material side, a lowermost layer, a titanium carbonitride layer, an adherent layer, an alumina layer, and a topmost layer, in the cited order. Each layer constituting the coat film will be described sequentially from the layer on the base material side.

<Lowermost Layer>

The coat film of the present invention preferably has a lowermost layer (the layer in contact with the base material) formed of Ti nitride between the base material and the titanium carbonitride layer. Since such a lowermost layer has high adherence with the base material, the coat film can be prevented from peeling off entirely even in the case corresponding to severe cutting conditions. By forming such a lowermost layer, sufficient adherence sustainable to a cutting work can be obtained, even in the case where compressive residual stress is applied to at least one layer on the coat film. The thickness of such a lowermost layer is preferably greater than or equal to 0.05 μm and less than or equal to 1 μm.

<Adherent Layer>

The coat film of the present invention preferably includes an adherent layer formed of $TiB_xN_y$ (in the formula, x and y each represent an atomic ratio, where $0.001 \leq x/(x+y) \leq 0.04$) immediately on the titanium carbonitride layer. Since such an adherent layer has a surface of microscopic acicular structure, favorable adherence with the alumina layer formed immediately above is exhibited.

The provision of an alumina layer directly on a titanium carbonitride layer is disadvantageous in that the alumina layer may peel or drop off from the titanium carbonitride layer. This problem can be eliminated by forming an adherent layer immediately under the alumina layer. Thus, favorable adherence with the alumina layer can be obtained.

In the formula set forth above, x and y are more preferably $0.003 \leq x/(x+y) \leq 0.02$. Accordingly, favorable adherence with the alumina layer can be obtained. The atomic ratio of Ti to BN is preferably 0.8-1.5 for Ti when the total of BN is 1. The adherent layer can contain an element included in another layer constituting the coat film of the present invention (particularly an element contained in the layer in contact with the adherent layer). Such an adherent layer preferably has a thickness greater than or equal to 0.05 μm and less than or equal to 1 μm, and further preferably the upper limit and lower limit are 0.8 μm and 0.1 μm, respectively. If this thickness exceeds 1 μm, the wear resistance is degraded, which is not preferable. If the thickness is below 0.05 μm, sufficient adherence with the alumina layer may not be exhibited.

<Alumina Layer>

The coat film of the present invention preferably includes an alumina layer between the topmost layer and the titanium carbonitride layer. Since such an alumina layer contains $Al_2O_3$ as the main component, favorable performance with respect to the oxidation wear during high speed cutting is exhibited, which promotes improvement in the wear resistance. As used herein, the expression "contains $Al_2O_3$ as the main component" implies containing 90 mass % or more of $Al_2O_3$, preferably constituted of only $Al_2O_3$ with the exception of inevitable impurities.

Preferably, such an alumina layer is mainly based on $Al_2O_3$ having an a-type crystal structure (hereinafter, also referred to as "$\alpha\text{-}Al_2O_3$"), or $Al_2O_3$ having a κ-type crystal structure (hereinafter, also referred to as "$\kappa\text{-}Al_2O_3$"). Among these, $\alpha\text{-}Al_2O_3$ is advantageous in that wear resistance is good generally at high speed cutting. Such a crystal structure can be confirmed by X-ray diffraction.

The alumina layer preferably has a thickness greater than or equal to 2 μm and less than or equal to 15 μm. More preferably, the upper limit is 10 μm and the lower limit is 4 μm. If the thickness exceeds 15 um, peeling may readily occur from the leading end of the cutting edge or at the boundary of the cutting edge, leading to degradation in the defect resistance. If this thickness is less than 2 μm, the crater wear resistance at the rake face is as well as the biting resistance in repetitive cutting such as threading or grooving may be degraded.

<Topmost Layer>

The coat film of the present invention preferably includes a topmost layer together with the titanium carbonitride layer. The topmost layer constitutes the surface of the coat film with any of Ti carbide, nitride, and carbonitride as the main component. The expression "with any of Ti carbide, nitride, and carbonitride as the main component" implies containing 90 mass % or more of any of Ti carbide, nitride, and carbonitride, preferably constituted of any of only the Ti carbide, nitride, and carbonitride with the exception of inevitable impurities. Further, the mass ratio of Ti to an element other than Ti (that is, C, N and CN) in each of the Ti carbide, nitride, and carbonitride is preferably greater than or equal to 50 mass % for Ti.

Among any of the Ti carbide, nitride, and carbonitride, a nitride of Ti (that is, a compound represented by TiN) is particularly preferable. Since TiN has the most discernible color (gold color) among such compound, there is the advantage that the corner of the cutting tip after being used for cutting is readily identified.

When the compound in the present invention is represented by a chemical formula such as TiN, any atomic ratio conventionally known is intended to be included if the atomic ratio is not particularly limited. It is not necessarily limited to one in the stoichiometric range. For example, when simply represented as "TiCN", the atomic ratio of "Ti" and "C" and "N" is not limited to only the case of 50:25:25. Similarly, when represented as "TiN", the atomic ratio of "Ti" and "N" is not limited to only the case of 50:50. As such atomic ratios, any conventional atomic ratio publicly known is intended to be included.

In the present invention, the topmost layer preferably has a thickness greater than or equal to 0.05 μm and less than or equal to 1 μm. Furthermore, the upper limit of the thickness is 0.8 μm, more preferably 0.6 μm, and the lower limit is 0.1 μm, more preferably 0.2 μm. If this thickness is less than 0.05 μm, the effect when compressive residual stress is applied is not sufficient, and the defect resistance is not so improved. If the thickness exceeds 1 μm, adherence with the layer located at the inner side of the topmost layer may be degraded.

<Production Method>

The coat film of the present invention is preferably formed by chemical vapor deposition (CVD). Accordingly, each layer of the coat film will have residual tensile stress until being subject to the blast processing that will be described afterwards, leading to significantly high adherence with the base material.

In the present invention, the film growing temperature in foiling a titanium carbonitride layer is preferably higher than the temperature of conventional MT-CVD, and lower than the temperature of conventional HT-CVD. Specifically, the film growing temperature is preferably greater than or equal to 900° C. and less than or equal to 1000° C. By forming a film at a film-growing temperature that is intermediate between the temperature of conventional MT-CVD and HT-CVD, interface diffusion of adjacent TiCN columnar crystals constituting the titanium carbonitride layer can be facilitated, which in turn can improve the bonding strength between crystals constituting the titanium carbonitride layer. Thus, the drop off of TiCN particles occurring due to the rubbing friction at the time of cutting can be suppressed. This allows a coat film having favorable defect resistance and wear resistance to be formed. The MT-CVD is directed to growing a film at a relatively low temperature of approximately 830° C.-900° C. whereas HT-CVD is directed to growing a film at a relatively high temperature of approximately 1000° C. or more.

By forming a film at the temperature in the aforementioned numerical range, a titanium carbonitride layer having a crystal orientation in which the (220) plane takes the highest peak intensity can be obtained. The titanium carbonitride layer has a surface that is smooth from the standpoint of crystal structure, and is superior in wear resistance. The difference in the film growing temperature between the titanium carbonitride layer and the adherent layer as well as between the titanium carbonitride layer and alumina layer that will be formed after the titanium carbonitride layer is formed is small. There is the advantage that the temperature change and thermal shock during film growth can be suppressed as low as possible.

If the film growing temperature is less than 900° C., sufficient slidability cannot be achieved since the crystal structure of the titanium carbonitride layer is oriented at the columnar (422) plane. If the temperature exceeds 1000° C., the decarburization in the cemented carbide base material or cermet base material becomes intense, leading to generation of a hard and brittle layer at the interface between the base material and the coat film. This brittle layer becomes the cause of degrading the adhesion between the base material and coat film.

Growing the titanium carbonitride layer of the present invention is carried out at a temperature approximately 100° C. lower than the temperature in conventional HT-CVD. As the carbon source for forming the titanium carbonitride layer, hydrocarbon with the carbon number 2 ($C_2H_2$ gas, $C_2H_4$ gas, and $C_2H_6$ gas), having higher activity than $CH_4$ gas, is preferably used. Accordingly, a film can be grown at a sufficient rate comparable to conventional HT-CVD, without degradation in the production efficiency.

A titanium carbonitride layer constituting the coat film of the present invention is grown under the condition of low degree of vacuum, higher than the conventional film growing pressure, i.e. at a film-growing pressure greater than or equal to 40 kPa and less than or equal to 80 kPa. By growing a film under such a low degree of vacuum condition, evaporation of Co constituting the coupled layer can be suppressed as low as possible when a base material formed of cemented carbide, for example, is used, which can suppress reduction in the bonding strength between WC particles. When a base material formed of cermet is employed, the evaporation of Ni constituting the coupled layer can be suppressed as low as possible, which can suppress reduction in the bonding strength between TiCN particles.

Moreover, since the mean free path between reaction gases is shortened under the aforementioned film growing condition of low degree of vacuum, the film growing rate is expedited, allowing the aspect ratio of the crystal texture constituting the titanium carbonitride layer to be increased. Thus, the titanium carbonitride layer may be of favorable columnar crystal having the maximum peak intensity at the (220) plane, which allows the hardness of the titanium carbonitride layer to be rendered uniform.

If a film is grown under a condition of high degree of vacuum less than 40 kPa, evaporation of the coupled layer in the base material is promoted, leading to degradation in the bonding strength between the WC particles or the TiCN particles in the base material. Accordingly, the interface between the coat film and the base material is susceptible to peeling, which facilitates a defect in the tool. If the film is grown under a condition of low degree of vacuum exceeding 80 kPa, the titanium carbonitride layer cannot be grown to have a crystal structure that is columnarly uniform. Depending upon the condition, a granular mixed texture will be formed to cause difference in texture. This prevents the titanium carbonitride layer to have a uniform hardness.

By forming a titanium carbonitride layer at a film growing pressure greater than or equal to 40 kPa and less than or equal to 80 kPa with the film growing temperature greater than or equal to 900° C. and less than or equal to 1000° C. as set forth above, the hardness of the titanium carbonitride layer can be rendered uniform. Therefore, chipping and defect will be less likely to be generated during the cutting work.

In the present invention, the raw material gas introduced when a titanium carbonitride layer is to be formed preferably includes at least a Ti source, C source, and N source, as well as $H_2$ or argon. Here, $TiCl_4$ gas or the like is preferably employed for the Ti source. For the N source, $N_2$ gas, $NH_3$ gas, $CH_3CN$ gas or the like are preferably employed.

For the C source, saturated hydrocarbon gas or unsaturated hydrocarbon gas with the carbon number 1 to 3 is preferably employed. For the saturated hydrocarbon gas with the carbon number 1 to 3, $CH_4$ gas, $C_2H_6$ gas, and $C_3H_8$ gas can be cited. For the unsaturated hydrocarbon gas with the carbon number 1 to 3, $C_2H_2$ gas, $C_2H_4$ gas, $C_3H_4$ gas, $C_3H_6$ gas or the like can be cited. In addition, $CH_3CN$ gas employed as the N source may be used as the C source.

In the context of the material gas introduced, the molar ratio of the C source to the Ti source (that is, C source molar ratio/Ti source molar ratio) is preferably set greater than or equal to 4 and less than or equal to 10. By introducing raw material gas in such a molar ratio, the elemental ratio of carbon included in the titanium carbonitride layer can be increased as compared to growing a film by the conventional MT-CVD. Therefore, a titanium carbonitride layer superior in hardness at high temperature is achieved. Furthermore, since the coefficient of friction of the titanium carbonitride layer becomes lower, the slidability is increased to allow the wear resistance to be improved.

If the molar ratio of the C source to the Ti source is below 4, the film growing rate of the titanium carbonitride layer becomes slower, which is not suitable for mass production. If this molar ratio exceeds 10, the structure of the crystal constituting the titanium carbonitride layer is coarse-grained, such that the hardness of the coat film is less likely to be uniform. Moreover, chloride will be generated in large quantity as unreacted material during the fabrication process, which is not favorable from the environmental aspect.

By applying blasting treatment to the surface of the coat film, the residual stress of the coat film can be removed, and compressive stress can be applied. Blasting can be executed by causing metal powder such as steel ball or ceramic powder such as alumina directly or a mixture thereof with a solvent such as water to collide against the surface of the coat film. Specific conditions of this collision and the like can be adjusted appropriately depending upon the structure of the coat film, the level of the compressive residual stress applied, and the like. Collision at an appropriate level is preferable since the compressive residual stress will not be applied if the collision is too weak.

EXAMPLES

The present invention will be described in further detail based on, but not limited to, these examples.

First, a cutting tip made of cemented carbide based on a composition of WC-5% Co (including inevitable impurities) was employed as the base material (shape: CNMA120408 made by Sumitomo Electric Hardmetal Company). The cutting edge of the base material was chamfered with a nylon brush including SiC grains to apply round honing. Then, the surface of the base material was cleaned. The nose radius of the base material was 0.8 mm.

The base material was set in a resistance heating type CVD furnace, and each layer of the coat film set forth in Table 1 was formed on the base material (formed sequentially on the base material in the cited order from the left column in Table 1) by the well-known thermal CVD. In Example 1, for example, a lowermost layer (TiN layer) of 0.6 μm, a titanium carbonitride layer (TiCN layer) of 7.5 μm, then an adherent layer (TiBN layer) of 0.8 μm, an alumina layer (κ-$Al_2O_3$ layer) of 2.8 μm, and a topmost layer (TiN layer) of 0.5 μm were formed in order on the base material. Thus, a surface coated cutting tool of Example 1 was produced. In a similar manner, the surface coated cutting tool of each example and each comparative example was produced.

TABLE 1

| | | Coat Film | | | | | | | | | |
|---|---|---|---|---|---|---|---|---|---|---|---|
| | | Lowermost layer | Titanium carbonitride layer (TiCN layer) | | | | Adherent layer | Alumina layer | | Topmost layer | Total |
| | | (TiN layer) | Layer | Crystal | | | (TiBN layer) | ($Al_2O_3$ layer) | | (TiN layer) | film |
| | | layer thickness (μm) | thickness (μm) | C/(C + N) | plane of peak intensity | Relative hardness Ht/Hs | ($Ht_{max}$/Hs − $Ht_{min}$/Hs)/ (Ht/Hs) | layer thickness (μm) | Layer thickness (μm) | Cystal structure | layer thickness (μm) | thickness (μm) |
| Example | 1 | 0.6 | 7.5 | 0.8 | (220) | 3.5 | 0.23 | 0.8 | 2.8 | κ type | 0.5 | 12.2 |
| | 2 | 0.5 | 9.7 | 0.74 | (220) | 3.3 | 0.30 | 0.7 | 6.8 | α type | — | 17.7 |
| | 3 | 0.7 | 15 | 0.76 | (220) | 3.3 | 0.24 | 0.4 | 2.5 | α type | 1 | 19.6 |
| | 4 | 0.7 | 15 | 0.76 | (220) | 3.3 | 0.24 | 0.4 | 2.5 | α type | — | 18.6 |
| | 5 | 0.8 | 7 | 0.73 | (220) | 3.4 | 0.24 | 0.9 | 15 | α type | 0.8 | 24.5 |
| | 6 | 0.6 | 7 | 0.73 | (220) | 3.4 | 0.24 | 0.9 | 15 | α type | — | 23.5 |
| | 7 | 0.6 | 13.7 | 0.75 | (220) | 3.3 | 0.24 | 1 | 5 | α type | — | 20.3 |
| | 8 | 0.8 | 17 | 0.76 | (220) | 3.4 | 0.29 | 0.5 | 3.5 | α type | 0.6 | 22.4 |
| | 9 | 0.5 | 9.8 | 0.77 | (220) | 3.5 | 0.23 | 1 | 10 | α type | 1 | 22.3 |
| | 10 | 0.5 | 9.8 | 0.77 | (220) | 3.5 | 0.23 | 1 | 10 | α type | — | 21.3 |
| | 11 | 0.7 | 13.5 | 0.7 | (220) | 3.2 | 0.25 | 0.7 | 5 | α type | 0.5 | 20.4 |
| | 12 | 0.7 | 13.5 | 0.72 | (220) | 3.1 | 0.26 | 0.7 | 5 | α type | — | 19.9 |
| Comparative Example | 1 | 0.8 | 12.6 | 0.65 | (422) | 2.5 | 0.56 | 0.7 | 8 | α type | 0.4 | 22.5 |
| | 2 | 0.8 | 12.6 | 0.65 | (422) | 2.5 | 0.56 | 0.7 | 8 | α type | 0.4 | 22.5 |
| | 3 | 0.8 | 12.6 | 0.75 | (422) | 2.8 | 0.43 | 0.7 | 8 | κ type | 1.2 | 19.1 |
| | 4 | 1 | 13 | 0.7 | (220) | 3.2 | 0.5 | 1 | 6.8 | α type | 0.5 | 22.3 |
| | 5 | 1 | 14.5 | 0.8 | (220) | 2.6 | 0.23 | 0.8 | 9.2 | α type | 0.5 | 26 |
| | 6 | 0.9 | 9.8 | 0.55 | (220) | 2.3 | 0.26 | 0.7 | 7.8 | κ type | 0.6 | 19.7 |

In Table 1, "layer thickness" of each layer represents the thickness of each layer constituting the coat film, and "total film thickness" represents the film thickness of the coat film. For such layer thickness and film thickness, the surface coated cutting tool was cut at a plane including the normal to its surface. The value obtained by observing the cut face by SEM was employed.

In Table 1, "C/(C+N)" represents the atomic ratio of carbon to the sum of the atomic ratio of carbon and nitrogen constituting the titanium carbonitride layer. For the atomic ratio, the value obtained by analyzing the titanium carbonitride layer by EPMA (Electron Probe Micro Analysis) was employed.

In Table 1, "crystal plane of peak intensity" represents the crystal plane of the highest peak intensity when the titanium carbonitride layer was analyzed by X-ray diffractometry using an X-ray diffraction device (product name: RINT2400 (product of Rigaku Corporation)).

In Table 1, "relative hardness" represents the average value of relative hardness Ht/Hs of indentation hardness Ht of the titanium carbonitride layer to indentation hardness Hs of the standard block for hardness. The method for calculating the average value of relative hardness Ht/Hs is set forth below. First, indentation hardness Hs of a standard block for hardness (product name: UMV905 (product of Yamamoto Scientific Tool Laboratory)) was measured by using a nano indentation hardness tester (device name: ENT-1100a (product of ELIONIX Inc.)).

Then, a specimen was cut along a plane including the normal to the surface of the coat film of the surface coated cutting tool. The cut surface was mechanically polished. Using a nano indentation hardness tester identical to that used for the standard block for hardness set forth above, an indenter was pushed against the titanium carbonitride layer in a direction perpendicular to the cut surface to measure indentation hardness Ht of the titanium carbonitride layer. By changing the position where the indenter was pushed, the indentation hardness of the titanium carbonitride layer was measured 30 times. Among the 30 measurements, any measurement of indentation hardness Ht with a discontinuous or unnatural stress-strain curve was determined to be an abnormal value and removed. All the other measured values of the indentation hardness were averaged to calculate the average value of indentation hardness Ht. By dividing this average value of indentation hardness Ht by indentation hardness Hs of the standard block for hardness, the average value of relative hardness Ht/Hs of the titanium carbonitride layer was calculated.

Then, upon removing any abnormal value from the 30 measurements of the indentation hardness set forth above, the maximum value $Ht_{max}$ and minimum value $Ht_{min}$ of the indentation hardness were divided by indentation hardness Hs of the standard block for hardness to calculate the maximum value $Ht_{max}/Hs$ and the minimum value $Ht_{min}/Hs$ of the relative hardness.

Then, the difference between the maximum value $Ht_{max}/Hs$ of the relative hardness and the minimum value $Ht_{min}/Hs$ of the relative hardness was obtained, and divided by the average value of relative hardness of the titanium carbonitride layer. The result is shown in the column of "$(Ht_{max}/Hs-Ht_{min}/Hs)/(Ht/Hs)$" of Table 1. A smaller value thereof indicates that variation in the hardnesss of the titanium carbonitride layer is low and that the titanium carbonitride layer has uniform hardness.

An example having "-" in the column of the layer thickness for the topmost layer in Table 1 implies that, subsequent to forming the coat film, the topmost layer alone was removed by blasting. By such processing, the residual tensile stress can be released, or the compressive residual stress can be applied.

Each of the layers constituting the coat film other than the titanium carbonitride layer was grown under the conditions shown in Table 2 below. The titanium carbonitride layer was formed by the conditions shown in Table 3. For example, in the process of growing a film of a titanium carbonitride layer in Example 1, reaction gas of $TiCl_4$:1.9 volume %, $CH_4$:8.8 volume %, $N_2$:3 volume %, and $H_2$:remainder was introduced such that the entire flow rate was 56.8 L/min. The pressure in the chamber was 80 kPa, and the temperature was 990° C.

TABLE 2

| | Temperature (° C.) | Pressure (kPa) | Raw Material Composition (mol %) | Total Flow (L/min) |
|---|---|---|---|---|
| Lowermost layer (TiN layer) | 980 | 7 | $H_2$(59.4); $N_2$(39.7); $TiCl_4$(0.9) | 40.4 |
| Adherent layer (TiBN layer) | 1000 | 7 | $H_2$(54.4); $N_2$(43.1); $TiCl_4$(1.8); $BCl_3$(0.7) | 54.6 |
| Alumina layer (κ type) | 980 | 7 | $H_2$(85.7); HCl(1.5); $CO_2$(6.9); CO(4.6); $H_2S$(0.1); $AlCl_3$(1.2) | 39.5 |
| (α type) | 1000 | 7 | $H_2$(89.9); HCl(3); $CO_2$(4.9); CO(0.9); $H_2S$(0.1); $AlCl_3$(1.2) | 47.4 |
| Topmost layer (TiN layer) | 1000 | 80 | $H_2$(49.5); $N_2$(49.5); $TiCl_4$(1) | 50.3 |

TABLE 3

| | | Temperature (° C.) | Pressure (kPa) | Raw Material Composition (mol %) | Total Flow (L/min) |
|---|---|---|---|---|---|
| Example | 1 | 990 | 80 | $H_2$(86.3); $N_2$(3); $CH_4$(8.8); $TiCl_4$(1.9) | 56.8 |
| | 2 | 970 | 40 | $H_2$(95.7); $CH_3CN$(0.3); $CH_4$(2.1); $TiCl_4$(1.9) | 54 |
| | 3 | 950 | 60 | $H_2$(88.6); $N_2$(3.2); $CH_4$(2.1); $C_2H_4$(4); $TiCl_4$(2.1) | 56.8 |
| | 4 | 950 | 60 | $H_2$(88.6); $N_2$(3.2); $CH_4$(2.1); $C_2H_4$(4); $TiCl_4$(2.1) | 56.8 |
| | 5 | 950 | 60 | $H_2$(88.6); $N_2$(3.2); $CH_4$(2.1); $C_2H_4$(4); $TiCl_4$(2.1) | 56.8 |
| | 6 | 950 | 60 | $H_2$(88.6); $N_2$(3.2); $CH_4$(2.1); $C_2H_4$(4); $TiCl_4$(2.1) | 56.8 |
| | 7 | 920 | 40 | $H_2$(89.6); $N_2$(3); $C_2H_4$(5.4); $TiCl_4$(2) | 73.8 |
| | 8 | 910 | 40 | $H_2$(90.3); $N_2$(3.1); $C_2H_2$(4.8); $TiCl_4$(1.8) | 68.2 |
| | 9 | 910 | 70 | $H_2$(89.9); $N_2$(3); $C_2H_6$(5); $TiCl_4$(2.1) | 73.8 |
| | 10 | 910 | 70 | $H_2$(89.9); $N_2$(3); $C_2H_6$(5); $TiCl_4$(2.1) | 73.8 |
| | 11 | 905 | 40 | $H_2$(89.6); $N_2$(3); $CH_3CN$(0.3); $C_2H_4$(5.1); $TiCl_4$(2) | 73.8 |
| | 12 | 905 | 50 | $H_2$(89.6); $N_2$(3); $CH_3CN$(0.3); $C_2H_6$(5.1); $TiCl_4$(2) | 73.8 |
| Comparative Example | 1 | 860 | 9 | $H_2$(82.4); $N_2$(15.1); $CH_3CN$(0.4); $TiCl_4$(2.1) | 59.6 |
| | 2 | 860 | 9 | $H_2$(82.4); $N_2$(15.1); $CH_3CN$(0.4); $TiCl_4$(2.1) | 59.6 |
| | 3 | 880 | 8 | $H_2$(95); $CH_3CN$(0.3); $C_2H_6$(3.2); $TiCl_4$(1.5) | 15.8 |
| | 4 | 1050 | 13 | $H_2$(88); $N_2$(2); $CH_4$(6); $TiCl_4$(4) | 56.8 |

TABLE 3-continued

| | Temperature (° C.) | Pressure (kPa) | Raw Material Composition (mol %) | Total Flow (L/min) |
|---|---|---|---|---|
| 5 | 850 | 10 | $H_2(82); N_2(4); C_2H_4(12); TiCl_4(2)$ | 56.8 |
| 6 | 850 | 8 | $H_2(84.7); N_2(10); C_2H_2(3); TiCl_4(2.3)$ | 59.8 |

<Cutting Test>

Using the surface coated cutting tools of Examples 1-12 and Comparative Examples 1-6, a cutting work test was carried out for 5 minutes under the conditions set forth below.

Cutting workpiece: FCD700 (inner diameter $\phi=250$ mm, length l=1000 mm

Cutting speed: 200 m/min
  Feeding rate: 0.3 mm/rev
  Cut: 2.0 mm
  Cutting oil: water-soluble By measuring the surface coated cutting tool before and after the cutting test using a vernier caliper, the width reduced by wear at the flank face was calculated, and indicated in the column of "flank face wear" in Table 4. One having a smaller amount of flank face wear indicates favorable wear resistance of the surface coated cutting tool.

After the cutting test, the rake face of the surface coated cutting tool was observed visually, and the width of the crater wear generated thereat in the longitudinal direction was measured. The crater wear resistance was evaluated based on the evaluation standard set forth below, and indicated in the column of "crater wear" in Table 4. The damage state of the surface coated cutting tool after the cutting test is shown in the column of "damage state" in Table 4.

tance, as compared to those in each of the comparative examples. Such improvement of the wear resistance and crater wear resistance is attributed to the crystal plane of the peak intensity of the titanium carbonitride layer being (220).

With regard to the damage state at the surface coated cutting tool of each example and each comparative example after the above-described cutting test is completed, the coat film exhibits normal wear in each example of the present invention whereas the coat film exhibits chipping and/or defect in each comparative example. The reason why the surface coated cutting tool of each example in the present invention is absent of a defect whereas the surface coated cutting tool of each comparative example exhibits chipping and/or defect is probably due to the hardness of the coat film being uniform in the surface coated cutting tool of each example, as compared to the those of each comparative example.

From the results set forth above, it has been shown that the surface coated cutting tool of the example of the present invention is superior in wear resistance and defect resistance, as compared to those of the comparative examples.

Although the invention has been described based on embodiments and examples in the present invention, it is intended that the features of the embodiments and examples set forth above may be combined appropriately.

TABLE 4

| | | Flank Face Wear (mm) | Crater Wear | Damage State |
|---|---|---|---|---|
| Example | 1 | 0.17 | A | Normal wear, minute crack at boundary |
| | 2 | 0.19 | B | Normal wear |
| | 3 | 0.17 | A | Normal wear |
| | 4 | 0.17 | A | Normal wear |
| | 5 | 0.18 | B | Normal wear |
| | 6 | 0.18 | B | Normal wear, few weld deposits |
| | 7 | 0.17 | A | Normal wear, few weld deposits |
| | 8 | 0.19 | B | Normal wear |
| | 9 | 0.19 | B | Normal wear |
| | 10 | 0.17 | B | Normal wear, few weld deposits |
| | 11 | 0.18 | B | Normal wear |
| | 12 | 0.16 | A | Normal wear |
| Comparative Example | 1 | 0.26 | D | Peeling at boundary, chipping |
| | 2 | 0.22 | C | Peeling at boundary |
| | 3 | 0.23 | D | Normal wear |
| | 4 | 0.25 | C | Leading end chipping, defect |
| | 5 | 0.5 | D | Defect |
| | 6 | 0.28 | D | Wear at flank face great |

<Evaluation Standard of Crater Wear>

A: wear width is less than or equal to 0.1 mm with leading end of cutting edge as a reference point, and no exposure of base material
B: wear width exceeds 0.1 mm and less than or equal to 0.2 mm with leading end of cutting edge as a reference point, and slight exposure of base material
C: wear width exceeds 0.2 mm and less than or equal to 0.3 mm, and exposure of base material
D: wear width exceeds 0.3 mm with leading end of cutting edge as a reference point, and exposure of base material or defect at leading end of cutting edge identified From the results shown in Table 4, it is apparent that the surface coated cutting tool of each example of the present invention has small flank face wear and the width in the longitudinal direction of the crater wear is small, as compared to those in each of the comparative examples. It can be said from the results that the surface coated cutting tool of each example has superior wear resistance and crater wear resis- It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A surface oated cutting tool comprising:
a base material, and
a coat film formed on the base material,
said coat film including at least one titanium carbonitride layer, wherein
said titanium carbonitride layer has a maximum value for an orientational index TC (220) among texture coefficients TC (hkl),
an average value of relative hardness Ht/Hs for a plurality of times of measurement is greater than or equal to 3, where an indentation hardness of a standard block for hardness is Hs and an indentation hardness of said titanium carbonitride layer is Ht, and
a difference between a maximum value $Ht_{max}$/Hs and a minimum value $Ht_{min}$/Hs of the relative hardness of said titanium carbonitride layer to said relative hardness Ht/Hs is less than or equal to 0.5.

2. The surface coated cutting tool according to claim 1, wherein said titanium carbonitride layer has a carbon atomic ratio to a total of carbon and nitrogen greater than or equal to 0.7.

3. The surface coated cutting tool according to claim 1, wherein said coat film includes at least one alumina layer, and said alumina layer is made of a type aluminium oxide, and has an average layer thickness greater than or equal to 2 gm and less than or equal to 15 μm.

\* \* \* \* \*

UNITED STATES PATENT AND TRADEMARK OFFICE
CERTIFICATE OF CORRECTION

PATENT NO. : 9,044,811 B2  
APPLICATION NO. : 13/820392  
DATED : June 2, 2015  
INVENTOR(S) : Paseuth et al.

It is certified that error appears in the above-identified patent and that said Letters Patent is hereby corrected as shown below:

In the Claims:

In claim 3, at column 15, in line 25, "a type aluminium oxide" should be "α type aluminium oxide"

In claim 3, at column 15, in line 26, "greater than or equal to 2 gm" should be "greater than or equal to 2 μm"

Signed and Sealed this
First Day of December, 2015

Michelle K. Lee
*Director of the United States Patent and Trademark Office*